United States Patent
Koini et al.

(10) Patent No.: US 10,943,740 B2
(45) Date of Patent: Mar. 9, 2021

(54) ELECTRICAL CONNECTION CONTACT FOR A CERAMIC COMPONENT, A CERAMIC COMPONENT, AND A COMPONENT ARRANGEMENT

(71) Applicant: Epcos AG, München (DE)

(72) Inventors: Markus Koini, Seiersberg (AT); Christoph Auer, Graz (AT); Jürgen Konrad, Graz (AT); Franz Rinner, Deutschlandsberg (AT); Markus Puff, Graz (AT); Monika Stadlober, Graz (AT); Thomas Wippel, Stainz (AT)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 16/447,639

(22) Filed: Jun. 20, 2019

(65) Prior Publication Data

US 2019/0304702 A1   Oct. 3, 2019

Related U.S. Application Data

(63) Continuation of application No. 15/550,672, filed as application No. PCT/EP2016/054007 on Feb. 25, 2016, now Pat. No. 10,395,843.

(30) Foreign Application Priority Data

Feb. 27, 2015   (DE) .................. 102015102866.2

(51) Int. Cl.
*H01G 4/38*    (2006.01)
*H01G 2/06*    (2006.01)
(Continued)

(52) U.S. Cl.
CPC ................. *H01G 4/38* (2013.01); *H01G 2/06* (2013.01); *H01G 4/228* (2013.01); *H01G 4/232* (2013.01);
(Continued)

(58) Field of Classification Search
CPC ...... H01G 4/228; H01G 4/232; H01G 4/2325; H01G 4/248; H01G 4/26; H01G 4/30;
(Continued)

(56) References Cited

U.S. PATENT DOCUMENTS 2,965,812 A   12/1960   Bedford, Jr.
3,022,480 A   2/1962   Tiffany
(Continued)

FOREIGN PATENT DOCUMENTS

CN   1585055 A   2/2005
CN   101599365 A   12/2009
(Continued)

OTHER PUBLICATIONS

AVX: Vertical, http://www.avx.com/products/ceramic-capacitors/stacked/vertical/, Accessed prior to Aug. 24, 2017 (4 pages).
(Continued)

*Primary Examiner* — Roshn K Varghese
(74) *Attorney, Agent, or Firm* — Nixon Peabody LLP

(57) ABSTRACT

An electrical connection contact (5) for a ceramic component (2) is specified. The connection contact (5) comprises a first material (M1) and a second material (M2) arranged thereon, wherein the first material (M1) has a high electrical conductivity and the second material (M2) has a low coefficient of thermal expansion.

16 Claims, 2 Drawing Sheets

Figure 1A:
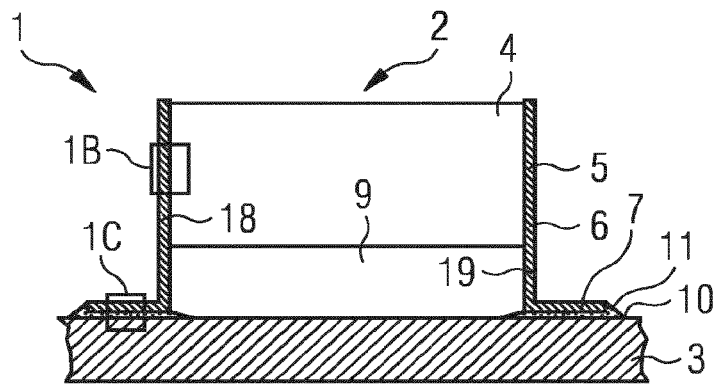

(51) Int. Cl.
*H01G 4/232* (2006.01)
*H01G 4/228* (2006.01)
*H01G 4/30* (2006.01)
*H05K 1/18* (2006.01)
*H01G 4/248* (2006.01)
*H01R 43/26* (2006.01)

(52) U.S. Cl.
CPC ............... *H01G 4/248* (2013.01); *H01G 4/30* (2013.01); *H01R 43/26* (2013.01); *H05K 1/181* (2013.01); *H05K 2201/10015* (2013.01); *H05K 2201/10757* (2013.01); *H05K 2201/10818* (2013.01); *H05K 2201/10909* (2013.01)

(58) Field of Classification Search
CPC ............ H01G 4/38; H01G 2/06; H01G 2/065; H01G 13/00; H01G 13/006; H01G 9/004–016; H01G 9/0029; H05K 1/181; H05K 3/3426; H05K 2201/10015; H05K 2201/10757; H05K 2201/10818; H05K 2201/10909; Y10T 29/43; H01R 43/26; Y02P 70/613
See application file for complete search history.

(56) References Cited

U.S. PATENT DOCUMENTS

| | | | |
|---|---|---|---|
| 3,082,397 A | 3/1963 | Clarkson | |
| 3,328,749 A | 6/1967 | Kukla | |
| 3,701,075 A | 10/1972 | Schullstrom | |
| 3,780,431 A | 12/1973 | Feeney | |
| 3,866,999 A | 2/1975 | Doherty, Jr. | |
| 4,072,376 A | 2/1978 | Shannon | |
| 4,216,523 A | 8/1980 | Harford | |
| 4,293,890 A * | 10/1981 | Varsane | H01G 4/248 361/310 |
| 4,404,744 A | 9/1983 | Stenz et al. | |
| 4,570,031 A * | 2/1986 | Inoue | H01G 4/06 174/72 B |
| 4,571,662 A | 2/1986 | Conquest et al. | |
| 4,578,736 A * | 3/1986 | Brown | H01G 2/065 361/306.1 |
| 4,617,609 A | 10/1986 | Utner | |
| 4,832,622 A | 5/1989 | Zahn | |
| 4,884,335 A | 12/1989 | McCoy et al. | |
| 5,402,321 A | 3/1995 | Izu et al. | |
| 5,712,758 A | 1/1998 | Amano | |
| 5,830,012 A | 11/1998 | Ortega et al. | |
| 5,945,732 A | 8/1999 | Burns | |
| 5,957,739 A | 9/1999 | Bianca | |
| 6,081,416 A | 6/2000 | Trinh | |
| 6,346,127 B1 | 2/2002 | Kuriyama | |
| 6,595,788 B2 | 7/2003 | Harper, Jr. et al. | |
| 6,885,538 B1 | 4/2005 | Ishii | |
| 6,924,967 B1 | 8/2005 | Devoe | |
| 6,976,855 B2 | 12/2005 | Kennedy et al. | |
| 7,331,799 B1 | 2/2008 | Lee | |
| 7,450,366 B2 * | 11/2008 | Kuriyama | H01G 2/065 361/523 |
| 7,570,479 B2 | 8/2009 | Lin | |
| 7,719,822 B2 | 5/2010 | Kodera | |
| 7,766,499 B2 | 8/2010 | Park | |
| 7,916,457 B2 | 3/2011 | Horio et al. | |
| 9,198,295 B2 | 11/2015 | Lhommeau | |
| 9,474,145 B2 | 10/2016 | Kim | |
| 9,502,612 B2 | 11/2016 | Margalit | |
| 2002/0054470 A1 | 5/2002 | Kuriyama | |
| 2005/0041367 A1 | 2/2005 | Yoshii | |
| 2009/0133904 A1 | 5/2009 | Koga et al. | |
| 2009/0147440 A1 | 6/2009 | Cygan | |
| 2009/0286706 A1 | 11/2009 | Chakrabarty | |
| 2010/0124848 A1 | 5/2010 | Atkinson et al. | |
| 2011/0089408 A1 | 4/2011 | Schmid | |
| 2011/0292567 A1 | 12/2011 | McConnell | |
| 2011/0293998 A1 | 12/2011 | Sato | |
| 2011/0294312 A1 | 12/2011 | Costello et al. | |
| 2013/0107419 A1 | 5/2013 | Hill | |
| 2013/0146347 A1 | 6/2013 | McConnell | |
| 2014/0160624 A1 | 6/2014 | McConnell | |
| 2014/0204503 A1 | 7/2014 | Ortner et al. | |
| 2014/0268486 A1 | 9/2014 | Hattori et al. | |
| 2015/0282325 A1 | 10/2015 | Fujii | |

FOREIGN PATENT DOCUMENTS

| | | | |
|---|---|---|---|
| CN | 102263214 A | 11/2011 | |
| CN | 102906836 A | 1/2013 | |
| CN | 103069518 A | 4/2013 | |
| CN | 103999176 A | 8/2014 | |
| DE | 19928190 A1 | 1/2001 | |
| DE | 102013109093 A1 | 2/2014 | |
| DE | 102013108753 A1 | 2/2015 | |
| EP | 0929087 A2 | 7/1999 | |
| EP | 2587502 A2 | 1/2013 | |
| JP | S55-138221 A | 10/1980 | |
| JP | S56-027912 A | 3/1981 | |
| JP | S58-168214 A | 10/1983 | |
| JP | S58-175625 U | 11/1983 | |
| JP | S60-137010 A | 7/1985 | |
| JP | S60-119739 U | 8/1985 | |
| JP | S62-169317 A | 7/1987 | |
| JP | H02-045620 U | 3/1990 | |
| JP | H02-161711 A | 6/1990 | |
| JP | H06-104031 | 4/1992 | |
| JP | H04-509124 A | 5/1992 | |
| JP | H04-364708 A | 12/1992 | |
| JP | H05-85060 A | 4/1993 | |
| JP | H05-043618 U | 6/1993 | |
| JP | H05-243075 A | 9/1993 | |
| JP | H07-235357 A | 9/1995 | |
| JP | H11-0741747 A | 3/1999 | |
| JP | H11-186100 A | 7/1999 | |
| JP | H11-214260 A | 8/1999 | |
| JP | 2000-003829 A | 1/2000 | |
| JP | 2000-49042 A | 2/2000 | |
| JP | 2000-182887 A | 6/2000 | |
| JP | 2000-200731 A | 7/2000 | |
| JP | 2000-223358 A | 8/2000 | |
| JP | 2000-235932 A | 8/2000 | |
| JP | 2002-008741 A | 1/2002 | |
| JP | 2002-057063 A | 2/2002 | |
| JP | 2002-217058 A | 8/2002 | |
| JP | 2002-313667 A | 10/2002 | |
| JP | 2006-24825 A | 1/2006 | |
| JP | 2006-073706 A | 3/2006 | |
| JP | 2006-148033 A | 6/2006 | |
| JP | 2008-130954 A | 6/2008 | |
| JP | 2010-123614 A | 6/2010 | |
| JP | 2010-161172 A | 7/2010 | |
| JP | 2011-040684 A | 2/2011 | |
| JP | 2012-023322 A | 2/2012 | |
| JP | 2012-522382 A | 9/2012 | |
| JP | 2014-042081 A | 3/2014 | |
| JP | 2014-179456 A | 9/2014 | |
| KR | 2009-0125715 A | 12/2009 | |
| KR | 102010010680 A | 2/2010 | |
| KR | 2010-0066080 A | 6/2010 | |
| KR | 2013-0089678 A | 8/2013 | |
| WO | WO 2006/022257 A1 | 3/2006 | |
| WO | WO 2010/111575 A2 | 9/2010 | |

OTHER PUBLICATIONS

AVX: Vertical—RoHS Compliant TurboCap, http://www.avx.com/products/ceramic-capacitors/stacked/rohs-compliant-tuthocap/, Accessed prior to Aug. 24, 2017 (4 pages).

AVX: Vertical—TurboCap, http://www.avx.com/products/ceramic-capacitors/stacked/turbocap/, Accessed prior to Aug. 24, 2017 (4 pages).

(56) References Cited

OTHER PUBLICATIONS

Li, H. et al., International Frontiers of Materials Science and Engineering, Feb. 28, 2003, Shandong Science and Technology Press, p. 129 (1 page).
Seki, A. et al: "MLCCs Brace up for Strength Requirement of Automotives", http://www.murata.com/~/media/webrenewal/about/newsroom/tech/capacitor/mlcc/ta13aa.a shx?la=zh-cn, Technology Focus, AEI Dec. 2013, p. 26-28 (3 pages).
TDK: "Film Capacitors—Metallized Polypropylene Film Capacitors (MKP)", http://en.tdk.eu.inf/20/20/db/fc_2009/MKP_B32674_678.pdf, Jun. 2015 (40 pages).
TDK: "Film Capacitors—Power Electronic Capacitors—MKP DC", http://en.tdk.eu/inf/20/50/ds/B2562_.pdf, May 2015 (21 pages).
TDK: "Film capacitors—Power electronic capacitors—PCC Series", http://en.tdk.eu/inf/20/50/ds/B25655A1148000.pdf, Jul. 2008 (5 pages).
TDK: "Multilayer Ceramic Chip Capacitors", https://product.tdk.com/info/en/catalog/datasheets/mlcc_automotive_soft_en.pdf, Nov. 2015 (14 pages).
TDK: "Multilayer Ceramic Chip Capacitors", hpps://product.tdk.com/info/en/catalog/datasheets/mlcc_automotive_megacap_en.pdf, Oct. 2015 (10 pages).
Wu, Z., et al.; "Surface Assembly Technology Base"; Jan. 31, 2002, National Defense Industry Press, p. 132 (1 page).
Patent Office of the People's Republic of China, Search Report in Chinese Patent Application No. 201580076969.X, dated Aug. 15, 2018 (9 pages, English translation only).
International Search Report corresponding to International Patent Application No. PCT/EP2016/054007, dated May 23, 2016 (2 pages).
EPCOS AG: "Ceralink Capacitor for fast-switching semiconductors"; http://www.epcos.com/inf/20/10/ ds/85803115105M002_LP.pdf; Low profile (LP) series; Feb. 19, 2015, Version 1.2, pp. 1-18.
TDK Corporation: "Multilayer Ceramic Chip Capacitor"; http://product.tdk.com/en/techjournal/archives/vol06_mlcc/contents06.html; Dated Nov. 3, 2015 (2 pages).

* cited by examiner

ELECTRICAL CONNECTION CONTACT FOR A CERAMIC COMPONENT, A CERAMIC COMPONENT, AND A COMPONENT ARRANGEMENT

CROSS-REFERENCE TO RELATED APPLICATIONS

This application is a continuation of U.S. patent application Ser. No. 15/550,672, filed Aug. 11, 2017, which is a U.S. National Stage of International Application No. PCT/EP2016/054007, filed Feb. 25, 2016, which claims the benefit of Germany Patent Application No. 10 2015 102 866.2, filed on Feb. 27, 2015, all of which are incorporated herein by reference in their entireties.

A connection contact for a ceramic component is specified. The connection contact is formed from a metal sheet, for example. In particular, the connection contact can be embodied as a lead frame or connection bracket.

Ceramic components require an electrical contacting for interconnection in electronic systems, e.g. by means of a printed circuit board. External contacts of the ceramic component are typically connected to the contact locations of a printed circuit board by a solder material. In power electronics, a particular technical challenge consists in realizing a thermomechanically stable linking that simultaneously offers the best possible electrical and thermal conductivity and a good radio-frequency behavior.

DE 10 2013 108 753 A1 describes a ceramic component comprising a connection element.

It is an object of the present invention to specify an improved connection contact for a ceramic component.

In accordance with a first aspect of the present invention, an electrical connection contact for a ceramic component is specified. The connection contact preferably serves for the electrical connection of the component on a carrier. By way of example, the connection contact serves for feeding electrical voltage and electrical signals to the component.

Furthermore, the connection contact can also serve for producing a mechanical securing and, if appropriate, a thermal connection to the carrier.

The ceramic component is preferably embodied as a multilayer component. By way of example, the component comprises a main body with ceramic layers and electrode layers arranged one above another. The layers are preferably sintered jointly. In particular, a capacitor, preferably a power capacitor, can be involved.

The connection contact is designed for securing on the component. Preferably, the connection contact is formed from a metal sheet. In this case, from a planar metal sheet, for example, firstly a planar piece having the dimensions of the connection contact is formed, for example by stamping out. Afterward, the connection contact is preferably brought to a bent shape. By way of example, the connection contact has an angled shape. The connection contact can also be a lead frame.

By way of example, the connection contact comprises at least one contact region for securing the connection contact on a main body of the ceramic component. Furthermore, the connection contact comprises for example at least one connection region for securing on a carrier, in particular on a printed circuit board. The connection region is preferably arranged at an angle with respect to the contact region. By way of example, the connection region is bent outward or inward.

In one embodiment, the connection contact comprises two connection elements. The connection elements are preferably designed for securing on opposite sides of the main body. The properties of the connection contact preferably correspondingly apply to each individual connection element.

The connection contact preferably comprises a material composite. In this case, the materials are arranged one above another in the form of layers, for example. In one embodiment, the connection contact comprises a first material and a second material arranged thereon. The first material is preferably embodied as a first layer and the second material as a second layer.

The first material has a high electrical conductivity. A high electrical conductivity is for example at least 40 m/(Ω·mm$^2$), preferably at least 50 m/(Ω·mm$^2$). Preferably, the first material also has a high thermal conductivity. A high thermal conductivity is for example at least 250 W/(m·K), preferably at least 350 W/(m·K).

The second material preferably has particularly good mechanical and thermomechanical properties. In particular, the second material has a low coefficient of thermal expansion. A low coefficient of thermal expansion is for example at most 5 ppm/K, preferably at most 2.5 ppm/K. The coefficient of expansion is preferably as close as possible to the coefficient of expansion of the ceramic. A good thermal adaptation to the ceramic can be achieved in this way. As a result, a build-up of stress during temperature changes can be avoided for the most part and cracking in the component can largely be prevented.

In one preferred embodiment, the first material comprises copper or consists of copper. Copper has a particularly good electrical and thermal conductivity.

By way of example, the second material comprises an iron-containing alloy. Preferably, the second material comprises Invar or consists of Invar. Invar denotes an iron-nickel alloy comprising approximately ⅓ nickel and ⅔ iron. This material has a particularly low coefficient of thermal expansion. In particular, the coefficient of thermal expansion is close to the coefficient of expansion of the ceramic. On account of the combination with the first material, even when the second material has a low electrical conductivity it is possible to ensure a sufficient conductivity for the connection contact.

In one embodiment, the connection contact additionally comprises a third material. The third material is arranged on the second material, such that the second material is arranged between the first material and the third material. The third material is preferably embodied as a third layer. Preferably, the third material is identical to the first material.

Preferably, the third layer has the same thickness as the first layer. The embodiment of the third material makes it possible preferably to prevent warpage of the connection contact in the event of a temperature change.

In particular, the connection contact can comprise a material composite composed of copper-Invar-copper. Such a composite can also be referred to as CIC composite.

In accordance with a further aspect of the present invention, a ceramic component comprising an electrical connection contact is specified. The connection contact and the ceramic component can be embodied as described above. In particular, the connection contact is secured on a main body of the component. The ceramic component is a ceramic multilayer capacitor, for example.

The connection contact is preferably secured on a main body of the component. By way of example, the connection contact comprises two contact elements arranged on opposite sides of the main body. The main body comprises an external contact, for example, on which the connection contact is secured. The external contact is embodied for example as a metal layer, in particular as a sputtered metal layer.

In one embodiment, the connection contact is secured on the main body by a contact material. The contact material is for example a sintering material, in particular sintering silver. In order to secure the connection contact on the main body, the contact material is applied for example on the main body and/or the connection contact. Afterward, the connection contact is arranged on the main body and the contact material is sintered. In this way, it is possible to obtain a high-temperature-resistant and low-impedance connection between the main body and the connection contact.

In one embodiment, the component is embodied in such a way that upon the connection contact being secured on the carrier, the main body is spaced apart from the carrier. A thermal and mechanical decoupling of the main body from the carrier can be achieved in this way. By way of example, the main body is arranged in a non-centered manner at the connection contact in the height direction in such a way that an air gap is formed with respect to a carrier.

In accordance with a further aspect of the present invention, a component arrangement comprising a ceramic component and a carrier, on which the component is secured, is specified. The component is preferably embodied as described above and comprises in particular the connection contact. The carrier is embodied for example as a printed circuit board. A ceramic carrier can also be involved.

The connection contact is connected to the carrier by a connecting material, for example. The connecting material is a solder material or sintering material, for example. In particular, the connection contact can be connected to the carrier by the sintering of a sintering material. By way of example, the sintering is effected in a pressure sintering method or a pressureless sintering method.

In accordance with a further aspect of the present invention, a method for producing a connection contact for a ceramic component is specified. The connection contact is preferably embodied as described above.

During the production of the connection contact, a metal sheet comprising the second material is provided. The second material preferably comprises Invar or consists of Invar. The first material is then applied, for example rolled, onto the second material. The second material preferably comprises copper or consists of copper. Afterward, the third material can be applied, in particular rolled, onto the opposite side of the metal sheet. The third material is preferably identical to the first material.

The connection contact can then be brought to a desired shape. By way of example, the outer dimensions of the connection contact are defined in a stamping process. The stamped-out piece is subsequently bent to a desired shape. In particular, an angled shape of the connection contact can be formed as a result.

In accordance with a further aspect of the present invention, a method for producing a ceramic component comprising a connection contact is described. In this case, a connection contact and a main body of the component are provided. The main body and the connection contact are preferably embodied as described above. The connection contact is subsequently secured on the main body. To that end, by way of example, a contact material is applied on the main body and/or the connection contact. In particular, the contact material is embodied as sintering material. Afterward, the connection contact is arranged on the main body and a sintering method is carried out.

A plurality of aspects of an invention are described in the present disclosure. All properties disclosed with respect to the connection contact, the component, the component arrangement and/or one of the methods are also correspondingly disclosed with respect to the respective other aspects, and vice versa, even if the respective property is not explicitly mentioned in the context of the respective aspect.

The subjects described here are explained in greater detail below on the basis of schematic exemplary embodiments which are not true to scale.

Figure 1B:
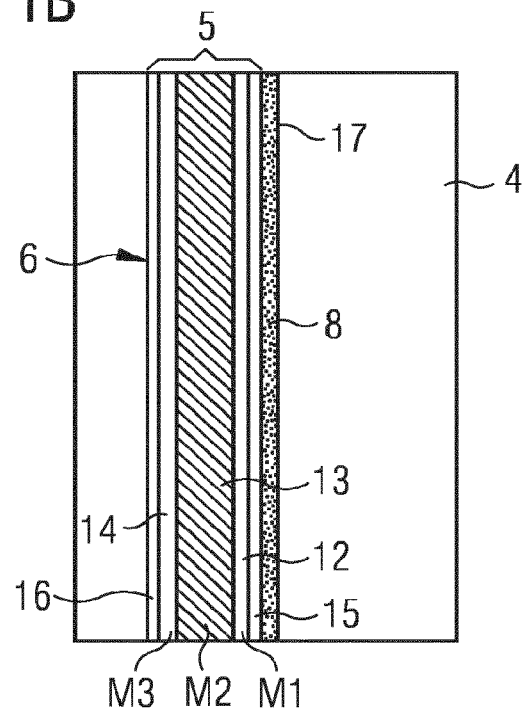
Figure 1C:
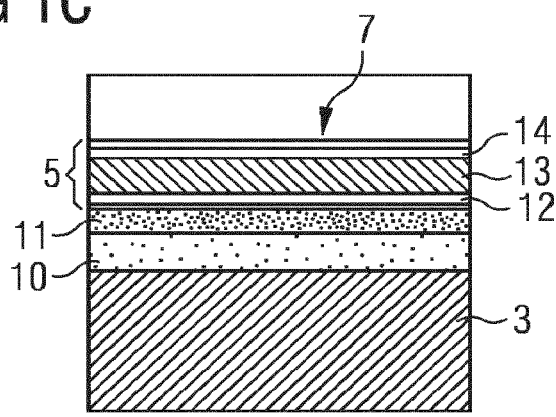

In the figures:

FIG. 1A shows one embodiment of a component arrangement in a schematic section view, FIGS. 1B and 1C show detail views of the component arrangement from FIG. 1A, FIGS. 2 to 5 show various embodiments of components in perspective views.

Preferably, in the following figures, identical reference signs refer to functionally or structurally corresponding parts of the various embodiments.

FIG. 1A shows a component arrangement 1 comprising an electrical component 2 and a carrier 3, on which the component 2 is arranged.

The electrical component 2 comprises a main body 4. The main body 4 preferably comprises a ceramic material. In this case, the component 2 is referred to as a ceramic component. The component 2 is embodied for example as a multilayer component. In particular, the main body 4 can comprise a layer stack having ceramic layers and electrode layers arranged therebetween. All the layers are preferably sintered jointly. By way of example, the electrode layers comprise copper. By way of example, the component 2 is embodied as a capacitor, in particular as a ceramic multilayer capacitor. In particular, a power capacitor can be involved.

The component 2 comprises a connection contact 5 for the electrical connection of the component 2. By way of example, the connection contact 5 comprises two connection elements 18, 19. The connection elements 18, 19 are arranged for example on opposite sides of the main body 4. It is also possible for only one of the connection elements 18, 19 to be designated as connection contact 5.

The connection contact 5 electrically connects the component 2 to the carrier 3. Furthermore, the connection contact 5 can also serve for mechanically securing the component 2 on the carrier 3. The connection contact 5 can also ensure a thermal linking to the carrier 3.

The connection contact 5 is preferably produced separately from the main body 5 and subsequently secured on the main body 4. Preferably, the connection contact 5 is formed from a metal sheet. In particular, the connection contact 5 can be a connection bracket or leadframe. The connection contact 5 preferably has the lowest possible coefficient of thermal expansion alongside a high thermal and electrical conductivity. These different properties are preferably ensured by a material composite, in particular by a multilayered construction of the connection contact 5. The construction of the connection contact 5 is described in detail in association with FIG. 1B.

The connection contact 5 comprises a contact region 6 for securing on the main body 4 and a connection region 7 for securing on the carrier 3. The contact region 6 is secured on the main body 4 by means of a contact material 8, for example. By way of example, the contact material 8 is arranged in layer form. By way of example, the contact material 8 is a sintering material. The connection contact 5 is preferably secured on the main body 4 by the sintering of the sintering material 8. By way of example, a low-temperature sintering process, in particular at a temperature in the region of 250° C., is carried out here.

The connection region 7 is arranged at an angle with respect to the contact region 6. By way of example, the connection region 7 is oriented at an angle of 90° C. with respect to the contact region 6. The connection region can be bent outward or inward. In the case of a connection region 7 bent inward, the connection region 7 preferably lies below the main body 4. In the case of a connection region 7 bent outward, the connection region 7 preferably lies alongside the main body 4. The connection contact 5 is preferably embodied in such a way that the main body 4 is arranged at a distance from the carrier 3. In particular, an air gap 9 is situated between the main body 4 and the carrier 3.

The carrier 3 is a printed circuit board, for example. By way of example, the printed circuit board is embodied as an FR4 circuit board. A ceramic substrate can also be involved. By way of example, the carrier 3 is embodied as a DCB (direct copper bonded) substrate in which copper is applied on a ceramic.

The carrier 3 has at least one contact location 10 on which the connection region 7 of the connection contact 5 is secured. By way of example, the contact location 10 is a soldering pad or a copper contact. By way of example, the connection region 7 is soldered or sintered to the contact location 10. To that end, by way of example, a connecting material 11 in the form of a solder material or sintering material is provided.

FIG. 1B shows an enlarged excerpt from FIG. 1A, the position of which is depicted by "IB" in FIG. 1A. In particular, the multi-layered construction of the connection contact 5 can be seen. The connection contact 5 comprises at least a first material M1 and a second material M2 arranged thereon. The first material M1 differs from the second material M2. In particular, the materials M1, M2 are embodied as a first layer 12 and a second layer 13 arranged thereon. The first layer is arranged nearer to the main body 4 than the second layer 13.

The first material M1 and thus the first layer 12 preferably has a particularly good electrical and thermal conductivity. The first layer 12 comprises the first material M1 or consists of the first material M1. Preferably, the first material M1 is copper. Copper has a specific electrical conductivity of approximately 58 m/($\Omega \cdot mm^2$), a thermal conductivity of approximately 400 W/(m·K) and a coefficient of thermal expansion of approximately 18 ppm/K.

The second material M2 and thus the second layer 13 preferably has a low coefficient of thermal expansion. Furthermore, the second layer 13 ensures for example the mechanical strength of the connection contact 5. The second layer 13 comprises the second material M2 or consists of the second material M2. By way of example, Invar is involved in this case. Invar has a specific electrical conductivity of approximately 1.2 m/($\Omega \cdot mm^2$), a thermal conductivity of approximately 13 W/(m·K) and a coefficient of thermal expansion of <2 ppm/K.

Consequently, the first material M1 haws a significantly greater electrical and thermal conductivity than the second material M2. The second material M2 has a significantly lower coefficient of thermal expansion than the first material M1.

The connection contact 5 can additionally comprise a third material M3. The third material M3 can be the same material as the first material M1. The third material M3 forms a third layer 14, wherein the third layer 14 is arranged on the second layer 13. The second layer 13 is arranged between the first layer 12 and the third layer 14. Preferably, the third layer 14 has the same thickness as the first layer 12. A bimetallic behavior of the connection contact 5 can be prevented by the third layer 14.

By way of example, the connection contact 5 has a thickness in the range of between 0.1 mm and 1 mm. In particular, the thickness can be 0.15 mm. By way of example, the ratio of the thickness of the second layer 13 to the thickness of the first layer 12 is from 1:1 to 5:1. In particular, the ratio of the thicknesses is 3:1. In the case of an embodiment of a third layer 14, the ratio of the thickness of the third layer 14 to the thickness of the second layer 13 to the thickness of the first layer 12 is for example from 1:1:1 to 1:5:1. In particular the ratio of the thicknesses is 1:3:1. By way of example, the second layer 13 comprises Invar having a thickness of 90 μm, the first layer 12 comprises copper having a thickness of 30 μm and the third layer 14 comprises copper having a thickness of 30 μm. The coefficient of thermal expansion of such a CIC connection contact is in the range of approximately 5-7 ppm/K, for example, depending on the thickness ratio chosen.

The connection contact 5 can furthermore comprise one or a plurality of further layers 15, 16. The further layers 15, 16 form for example the outer sides of the connection contact 5. By way of example, electroplating layers 15, 16, in particular silver layers, are involved. The electroplating layers have for example in each case a thickness in the range of 5 μm to 10 μm. The further layers serve for example for passivation for the first and/or the third layer 12, 14. In particular, these layers can offer tarnishing protection. Furthermore, these layers can provide solderable surfaces or improve the connection to a sintering material.

In order to produce the connection contact 5, by way of example, the second layer 13 is provided and this is followed by arranging thereon the first layer 12 and, if appropriate, the third layer 14. The second layer 13 is provided in particular as a metal sheet. By way of example, the first and third layers 12, 14, are rolled onto the second layer 13. Afterward, by way of example, the electroplating layers 15, 16 are applied on both sides. By way of example, a piece is then stamped out from the multi-layered metal sheet and bent to a desired shape.

The connection contact 5 is preferably secured on an external contact 17 of the main body 4. The external contact 17 is in electrical contact with the electrode layers of the main body 4. The external contact 17 comprises at least one sputtered layer, for example. The external contact 17 can comprise a plurality of layers arranged one above another, in particular a plurality of sputtered layers. By way of example, the external contact 17 comprises components for adhesion promotion, for a diffusion barrier and for further contacting. In one embodiment, a Cr/Ni/AG layer construction is involved. By way of example, the external contact 17 has a thickness in the region of 1 μm.

The connection contact 5 is connected to the external contact 17 by a contact material 8. The contact material 8 preferably has a high electrical and thermal conductivity. Furthermore, the contact material 8 preferably has a high robustness vis-à-vis thermal cycling loads and a high adhesion force. By way of example, the contact material 8 comprises a sintering material, in particular sintering silver. The connection contact 5 is then secured with the main body 4 by the sintering of the contact material 8. By way of example, the contact material 8 has a thickness in the region of 20 μm. The contact material 8 is embodied for example like the contact layer described in DE 10 2013 108 753 A1.

In order to secure the connection contact 5 on the main body 4, by way of example, the contact material 8 is applied on the main body 4 and/or the connection contact 5. The connection contact 5, in particular the connection elements 18, 19 are then arranged on the main body 4 and secured in a sintering method. By way of example, a low-temperature sintering method is carried out here as well.

FIG. 1C shows an enlarged excerpt from FIG. 1A, the position of which is depicted by "1C" in FIG. 1A. In particular, the connection of the connection contact 5 to a contact location 10 of the carrier 3 can be seen here. The carrier 3 with the contact location 10 is embodied for example as a printed circuit board having contact pads or as a ceramic substrate having contact pads, in particular as a DCB substrate.

In one embodiment, the securing is realized by soldering. By way of example, for this purpose a lead-free SAC solder is used as connecting material 11. In an alternative embodiment, the securing is realized by sintering. By way of example, for this purpose a sintering silver material is used as connecting material 11. In this case, pressureless sintering or pressure sintering can be carried out. In this case, the connection regions 7 bent outward enable a particularly good connection in a pressure sintering process, since pressure can be exerted directly on the connection regions 7, without any risk of prior damage to the main body 4 or the external contact 17.

The construction of the connection contact 5 in its connection region 7 corresponds to the construction in its contact region 6. In particular, the connection contact 5 comprises a multi-layered construction, for example a CIC construction with electroplating layers applied on both sides.

FIGS. 2 to 5 show various embodiments of connection contacts 5 and components 2 comprising the connection contacts 5. The connection contacts 5 in each case comprise the material composite described with regard to FIGS. 1A-1C. All the components 2 can be secured on a carrier using SMD mounting, i.e. surface mounting.

Figure 2:
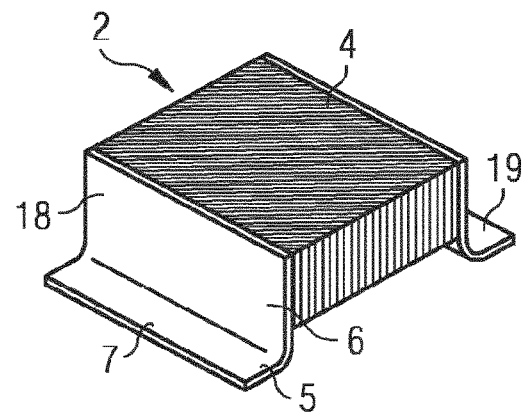

FIG. 2 shows a connection contact 5 in the same embodiment as the connection contact 5 from FIGS. 1A-1C.

In particular, the connection contact 5 comprises two connection elements 18, 19, which are arranged on opposite sides of a main body 4 of a component 2. The connection elements 18, 19 each comprise a contact region 6 and a connection region 7 bent outward. Consequently, the connection region 7 leads away from the main body 4. In the case of such a geometry, the connection contact 5 can be secured on a carrier 3 particularly well in a pressure sintering process.

The main body 4 has a cuboidal shape. The connection contact 5 extends completely over two longitudinal sides of the main body 4. The connection contact 5 can also extend only partly over outer sides of the main body. There is a significant height difference between an underside of the main body 4 and an underside of the connection region 7, such that the main body 4 can be arranged at a distance from the carrier 3.

Figure 3:
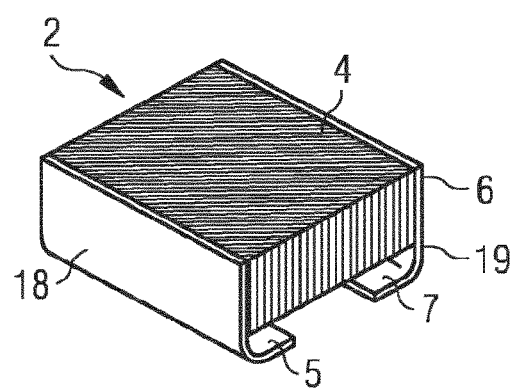

FIG. 3 shows a further embodiment of a connection contact 5 and of a component 2 comprising the connection contact 5. In contrast to the connection contact 5 from FIG. 2, the connection region 7 here is bent inward. The connection region 7 is arranged below the main body 4. Here, too, an air gap 9 is situated between an underside of the main body 4 and an underside of the connection region 7. The main body 4 is thus arranged in a non-centered manner with respect to the connection contact 5 in the height direction.

Figure 4:
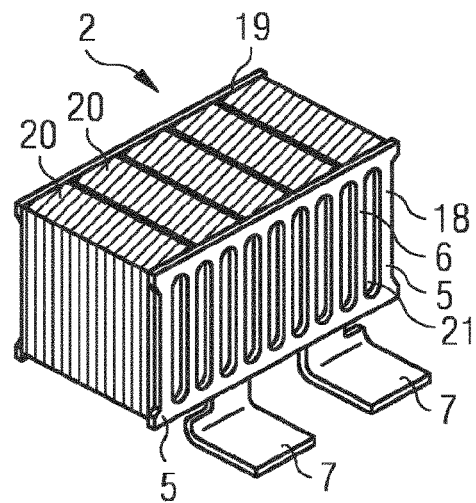

FIG. 4 shows a further embodiment of a connection contact 5 and of a component 2 comprising the connection contact 5. The component 2 comprises a main body 4 having a plurality of partial bodies 20. By way of example, five partial bodies 20 are provided. The connection contact 5 comprises two connection elements 18, 19. A common electrical contact for all the partial bodies 20 is produced via the connection contact 5. Consequently, the partial bodies 20 are connected in parallel.

The connection elements 18, 19 each comprise a plurality of connection regions 7 for securing on a carrier. This enables stable securing even in the case of a relatively large design. The connection regions 7 are bent outward.

Cutouts 21 are provided in the contact region 6. The contact region 6 extends over an entire longitudinal side of the main body 4.

Figure 5:
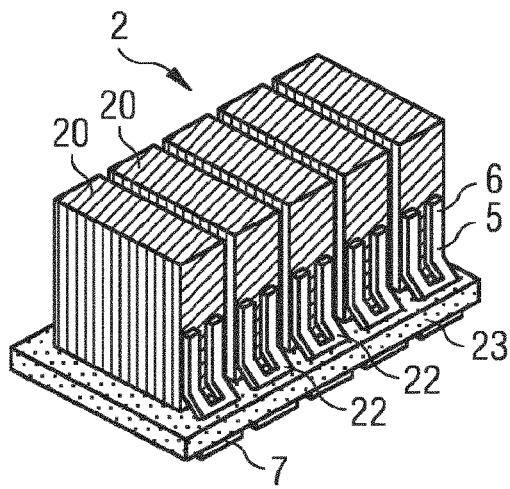

FIG. 5 shows a further embodiment of a connection contact 5 and of a component 2 comprising the connection contact 5. As in FIG. 4, the component 2 comprises a main body 4 having a plurality of partial bodies 20.

The component 2 is embodied in the form of a variable "endless" design. In particular, the component 2 can comprise as many partial bodies 20 as desired and can subsequently be separated into smaller components 2. To that end, the connection contact 5 has a separable form, for example. In particular, the connection contact 5 comprises a multiplicity of partial connections 22 that respectively contact a partial body 20. Each partial connection 22 comprises a contact region 6 for contacting a partial body. The contact regions 6 each comprise two contact arms that bear on a partial body 20. The connection contacts 5 are embodied in a resilient fashion, for example. The partial connections 22 can be connected to one another by thin webs (not shown). The partial connections 22 can be singulated by the webs being perforated.

In order to increase the mechanical stability, the component 2 comprises a base 23, for example a plastic base, on which the main body 4 is arranged. The connection contact 5 is lead through the base 23. Alternatively, the connection contact 5 can also be lead around a narrow side of the base 23.

LIST OF REFERENCE SIGNS

1 Component arrangement
2 Component
3 Carrier
4 Main body
5 Connection contact
6 Contact region
7 Connection region
8 Contact material
9 Air gap
10 Contact location
11 Connecting material
12 First layer
13 Second layer
14 Third layer
15 Further layer
16 Further layer
17 External contact
18 Connection element
19 Connection element
20 Partial body
21 Cutout
22 Partial connection
23 Base
M1 First material
M2 Second material
M3 Third material

The invention claimed is:

1. Ceramic component,
comprising several sintered bodies, each sintered body comprising a stack of ceramic layers and electrode layers, wherein the ceramic layers and electrode layers are sintered together, wherein the sintered bodies are located adjacent to each other with a gap located between side faces of the sintered bodies facing each other, wherein the gap extends along the entire area of the side faces of the sintered bodies, and
two separate electric connection contacts that are not electrically connected to each other and that are attached to opposite sides of the sintered bodies, wherein the ceramic component is separable into smaller components,
wherein each of the connection contacts comprises several partial contacts, wherein each of the partial contacts contacts one of the sintered bodies, wherein the partial contacts are connected by thin links to each other, and wherein the thin links are breakable for separating the ceramic component into smaller components.

2. The ceramic component of claim 1,
wherein the connection contacts are formed from a metal plate.

3. The ceramic component of claim 1,
wherein each of the connection contacts comprises a connection area for attachment on a wiring board.

4. The ceramic component of claim 3,
wherein the connection area is bent inwardly or outwardly.

5. The ceramic component of claim 1,
wherein each of the connection contacts comprises a first layer comprising a first material and a second layer arranged thereon, the second layer comprising a second material, wherein the first material has an electric conductivity of at least 40 m/$\Omega$mm$^2$ and the second material has a thermal expansion coefficient of at most 5 ppm/K.

6. The ceramic component of claim 5,
wherein the proportion of a thickness of the second layer to a thickness of the first layer is between 1:1 and 5:1.

7. The ceramic component of claim 5,
wherein each of the connection contacts comprises at least one further layer for improving the connection to a sintering material.

8. The ceramic component of claim 1,
wherein each of the connection contacts comprises at least one layer comprising copper and at least one layer comprising Invar.

9. The ceramic component of claim 1,
wherein each of the connection contacts is attached by a sintering material on the sintered bodies.

10. The ceramic component of claim 1,
wherein each of the partial contacts extends from a first edge of one of the sintered bodies along a side face of the sintered body but does not extend up to a second edge of the respective sintered body, the second edge being opposite to the first edge.

11. The ceramic component of claim 1,
wherein each of the connection contacts comprises a connection area for attachment on a carrier, wherein the thin links of each of the connection contacts are located near the connection area.

12. Method of producing a ceramic component,
the method comprising the steps of:
providing a plurality of sintered bodies, each sintered body comprising a stack of ceramic layers and electrode layers, wherein the ceramic layers and electrode layers are sintered together, wherein the sintered bodies are located adjacent to each other with a gap located between side faces of the sintered bodies facing each other, wherein the gap extends along the entire area of the side faces of the sintered bodies,
providing two separate connection contacts that are not electrically connected to each other, wherein each of the connection contacts includes several partial contacts, wherein the partial contacts are connected by thin links to each other;
placing the sintered bodies between the two connection contacts thereby forming a component arrangement;
separating the component arrangement between two of the sintered bodies, wherein the thin link of the connection contact between the sintered bodies is broken.

13. The method of claim 12,
wherein each of the connection contacts is formed by stamping out of a metal plate.

14. The method of claim 12,
wherein each of the connection contacts comprises a first layer comprising a first material and a second layer comprising a second material, wherein for producing the connection contacts the first material is rolled onto the second material.

15. The method of claim 12,
wherein each of the partial contacts extends from a first edge of one of the sintered bodies along a side face of the respective sintered body but does not extend up to a second edge of the respective sintered body, the second edge being opposite to the first edge.

16. A ceramic component,
comprising several sintered bodies, each sintered body comprising a stack of ceramic layers and electrode layers, wherein the ceramic layers and electrode layers are sintered together,
and two separate electric connection contacts that are not electrically connected to each other and that are attached to opposite sides of the sintered bodies, wherein the ceramic component is separable into smaller components,
wherein each of the connection contacts comprises several partial contacts, wherein each of the partial contacts contacts one of the sintered bodies, wherein the partial contacts are connected by thin links to each other, and wherein the thin links are breakable for separating the ceramic component into smaller components,
wherein each of the partial contacts extends from a first edge of one of the sintered bodies along a side face of the sintered body but does not extend up to a second edge of the respective sintered body, the second edge being opposite to the first edge.

* * * * *